United States Patent [19]
Frei

[11] Patent Number: 5,189,306
[45] Date of Patent: Feb. 23, 1993

[54] GREY-SPLICE ALGORITHM FOR ELECTRON BEAM LITHOGRAPHY POST-PROCESSOR

[75] Inventor: Joseph B. Frei, Hopewell Junction, N.Y.

[73] Assignee: International Business Machines Corporation, Armonk, N.Y.

[21] Appl. No.: 856,605

[22] Filed: Mar. 24, 1992

[51] Int. Cl.$^5$ .......................................... H01V 37/302
[52] U.S. Cl. .................................. 250/492.2; 250/398
[58] Field of Search ................. 250/492.2, 492.22, 398

[56] References Cited

U.S. PATENT DOCUMENTS

| | | | |
|---|---|---|---|
| 4,507,738 | 3/1985 | Nozawa et al. | 364/474 |
| 4,816,692 | 3/1989 | Rudert, Jr. | 250/492.2 |
| 4,827,423 | 5/1989 | Beasley et al. | 364/468 |
| 4,835,700 | 5/1989 | Tanaka et al. | 364/474.23 |

Primary Examiner—Jack I. Berman
Attorney, Agent, or Firm—Whitham & Marhoefer

[57] ABSTRACT

A method of developing grey-splices for use in an electron beam exposure apparatus subdivides rectangles of which a desired pattern is formed and which lie in sub-field overlap zones into sections and examines each section of the sub-field overlap zone to determine the best candidate for greying in order to avoid blooming due to overexposure and to minimize the possibility of exposure discontinuity. A data structure called a greytable list is accumulated to represent the portions of rectangles which lie in each section. Processing of each rectangle is minimized and groups of rectangles are processed in chains to increase the throughput of the system. The e-beam exposure apparatus is operated at optimal efficiency by minimizing the number of exposure spots which are greyed.

15 Claims, 10 Drawing Sheets

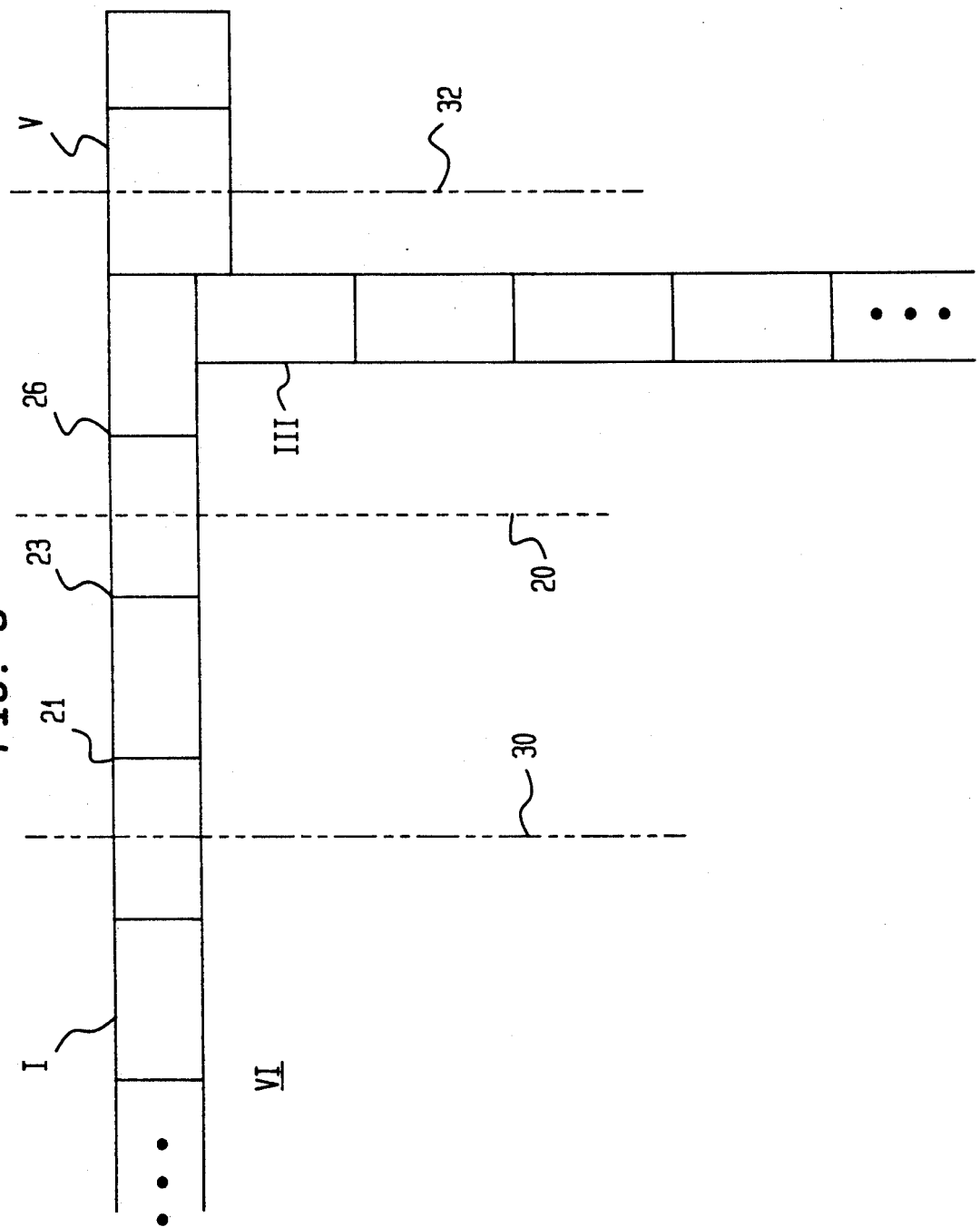

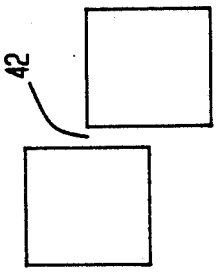
FIG. 4a"
(PRIOR ART)
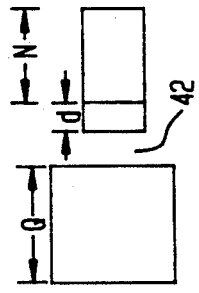
FIG. 4b"
(PRIOR ART)
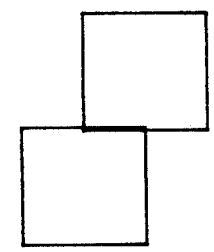
FIG. 4c"
(PRIOR ART)
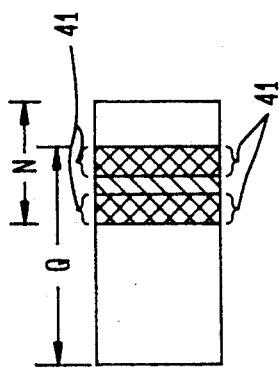
FIG. 4a'
(PRIOR ART)
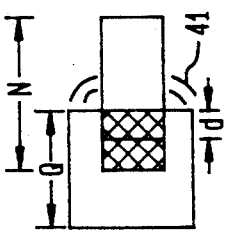
FIG. 4b'
(PRIOR ART)
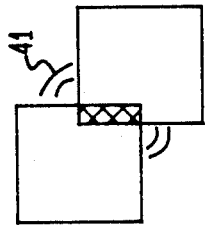
FIG. 4c'
(PRIOR ART)
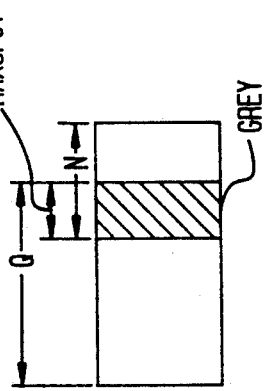
FIG. 4a
(PRIOR ART)
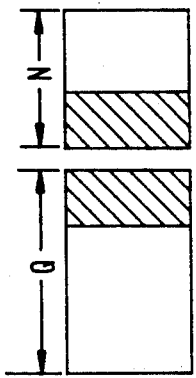
FIG. 4b
(PRIOR ART)
FIG. 4c
(PRIOR ART)

FIG. 13
TABLE I
CASE 1
GREYTABLE ENTRY
INPUT PORTION
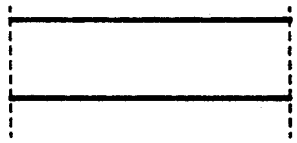
CASE 2
GREYTABLE ENTRY
INPUT PORTION
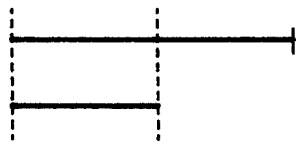
CASE 3
GREYTABLE ENTRY
INPUT PORTION
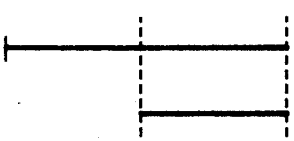
CASE 4
GREYTABLE ENTRY
INPUT PORTION
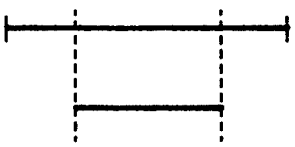

GREY-SPLICE ALGORITHM FOR ELECTRON BEAM LITHOGRAPHY POST-PROCESSOR

BACKGROUND OF THE INVENTION

1. Field of the Invention

The present invention generally relates to electron beam (e-beam) deflection and exposure systems and, more particularly, to electron beam lithography for the high accuracy exposure and patterning of resist masks during the manufacture of semiconductor devices.

2. Description of the Prior Art

In order to achieve high accuracy in the deflection of an electron beam, multiple stage deflection systems have become well-known in the art in a range of devices including high resolution displays. In particular, electron beam lithography has been used in the exposure of sensitized resist materials for the formation of masks to cause selective etching or material deposition in the processing of semiconductor wafers and chips for a number of years. Due to the small size and high accuracy with which selected areas must be exposed and the speed requirements of manufacturing processes for practical throughput rates, the demands on electron-optical deflection systems have been particularly stringent. In order to maintain the accuracy required in the electron-optical deflection system, it has often been necessary to employ deflection arrangements which are not capable of covering the entirety of the desired writing field. In such a case, the writing field is normally divided into sub-fields which are then separately written in succession, altering the position of the target or the coarse positioning of the electron beam from sub-field to sub-field. Such a division of the writing area can be done in three or more levels if necessary to achieve the desired accuracy and speed of electron beam exposure.

The relationship of the writing area and sub-fields is illustrated in FIG. 1, with respect to which some terminology which will be used in this application will be defined. The entire field or writing area 10 on which an image is to be formed is indicated by outline 12. Writing area 10 is divided into a matrix of sub-fields, a nominal sub-field is indicated at 14. The location numbers of sub-fields is conventionally numbered in the x direction as 0 through n and in the y direction as 0 through m. The number of sub-fields is arbitrary, as is the number of rows and columns of the matrix into which writing area 10 is divided. The only constraint on the division of writing area 10 is that the dimensions of each sub-field must be less than the maximum deflections available from a given (e.g. most minor) level of deflection available in the electron beam deflection system. The difference between the dimensions of the maximum deflection of that level of the deflection system and the chosen sub-field dimensions yields a margin or extension 16 for the sub-field. Since the adjacent sub-fields, by definition, are contiguous, the sub-field extensions overlap adjacent sub-fields. The dimension of the mutual sub-field extension overlaps of adjacent sub-fields 18 is commonly referred to as an overlap zone. For pairs of rows or columns of sub-fields, the aggregate area of overlap is referred to as a y-overlap zone or x-overlap zone, respectively, The term direction overlap zone is generic to x- and y-overlap zones.

To form patterns in each of the sub-fields, it is the common practice to form the desired e-beam exposure pattern of rectangles, each of which may correspond to one or more spot rectangles or spots, as shown for an arbitrary pattern in FIGS. 2a and 2b, which will also be used to define some of the terminology used in this specification. FIG. 2a shows an arbitrary shape to be exposed by the e-beam exposure system, as indicated by outline 21. Known arrangements for fitting rectangles into a desired shape are also able to outline the shape with rectangles such as rectangles I-IV which are then referred to as "exterior". This operation is called "sleeving". Exterior rectangles also include rectangles such as rectangle V which is not sleeved since edges thereof are less than a split dimension apart which, in turn, is usually less than a maxspot dimension which is the maximum transverse dimension in either coordinate direction which can be produced by the e-beam exposure tool. The other spot rectangles tiling the shape but not located at a pattern edge such as rectangle VI are referred to as "interior". The distinction between exterior and interior rectangles is useful for purposes of producing an exposure since accuracy of exposure "dose" (e.g. the product of time and intensity of the exposure) is less critical for interior spot rectangles than for exterior spot rectangles.

This difference in sensitivity to dose accuracy exists because sensitized films such as resists will tend to exhibit blooming if overexposure is especially severe. This effect can also be observed with photographic films and phosphors of display tubes (and can also be aggravated by secondary emission effects in such devices). In patterning of resists as masks, the film should reach a saturation level of exposure to develop full contrast (e.g. to avoid grey level areas in the completed exposure). However, if the exposure dose is significantly greater than that required to saturate the material, adjacent areas may behave as if exposed as well, resulting in blooming and a loss of dimensional accuracy and edge definition in the resulting image if the exposed area is an exterior rectangle. Any blooming of interior rectangle, however, will only be masked by an exterior rectangle if the width of exterior rectangles is greater than the width of the "bloom". Typically, the blooming of interior rectangles can be reasonably limited and the sleeve dimension shown in FIG. 2 is chosen to fully mask the effect.

As noted above, the spot rectangles each have a maximum dimension in a coordinate direction which is limited by the beam shaping of the electron optical arrangement. This maximum dimension is referred to as the maxspot dimension or, simply, maxspot. The term "maxspot" is also used to refer to any spot rectangle which has one of two coordinate dimensions equal to the maxspot dimension. In FIG. 2b, for example, maxspots are marked with an F to indicate that they are full maxspot size in at least one coordinate direction. Compare, for example spot rectangles M1 and M2 which are of differing heights but are both of a maxspot dimension in the x-direction.

If required by the desired pattern, spot rectangles having one or both orthogonal dimensions less than the maxspot dimension can be formed. The maximum dimension in either or both coordinate directions may be reduced as required by the pattern to be exposed. A spot rectangle in which neither dimension is as great as the maxspot dimension is referred to as a remainder spot as illustrated at R1 and R2 of FIG. 2b.

The rectangles, each including one or more spot rectangles, which form the pattern are non-overlapping and tiled into the shape during sleeving from left to right and top to bottom, as illustrated in FIG. 2a. It is to be understood that the scale of FIGS. 2a and 2b is much enlarged from that of FIG. 1 and the non-overlapping rectangles of FIG. 2, identified by Roman numerals therein are not to be confused with the rectangular sub-field areas of FIG. 1. Similarly, spot rectangles are not to be confused with the rectangles (e.g. I–VI) defining the pattern.

It is also to be understood that, in practice, the rectangles forming spots and hereinafter referred to as spots or spot rectangles, as produced by the e-beam device, will often have an aspect ratio generally in the range of 2:1 to 5:1 since the sleeve dimension is normally set in accordance with the best focus of the e-beam exposure apparatus. (The ends of the spots in the direction of maxspot length typically abut another rectangle and focus is less critical.) For example, the largest (e.g. maxspot) spot rectangles illustrated in FIG. 5 have an aspect ratio of 3:1. This relatively high aspect ratio in FIG. 5 is a result of the pattern to be formed and the split distance, referred to above which is, by definition, the maxspot size or less. The split distance is a predetermined maximum width of a pattern portion in which slleving is not permitted. Therefore the entire width of the pattern is exposed by a single spot having a width which is less than the maxspot size. If the pattern permits, sleeving and tiling of the pattern could consist primarily of spot rectangles which are of maxspot size in both coordinate directions. However, the sleeve dimension is often chosen to be less than the split dimension to reduce the number of exterior spot rectangles which must be produced when the pattern has many fine details.

Under normal circumstances, exposure doses can be fairly well-regulated within a sub-field. However, when the entirety of a pattern cannot be formed within a single sub-field or a sub-field plus its extension, registration problems from many possible causes may result in errors of occlusion between the portions of the pattern exposed from respective sub-fields. Therefore, it is common in the art to carry the pattern to be written from each of the respective sub-fields into the respective sub-field extensions at a reduced exposure dose. The overlap of rectangles produced according to the respective sub-fields will then reduce the likelihood of discontinuities in the exposure pattern and more reliably form the desired pattern and corresponding product. The process of creating this overlap at reduced exposure is referred to as grey-splicing, grey-splice, greying or, simply grey. (An alternative spelling, "gray" is also used in such terms and refers to the same process.) This process is quite critical since the exposure dose contribution from each sub-field must be kept within close limits to avoid blooming from the multiple exposure while keeping total exposure levels close to saturation even though correct registration cannot be assumed. In other words, if the occlusion errors cause a non-greyed area to overlap with a greyed or non-greyed area of another sub-field, substantially excess exposure will result. Conversely, if the sub-field areas are separated, areas in the gap between the sub-fields may receive only a greyed exposure dose corresponding to a rectangle of only a single sub-field or, in some circumstances, no exposure at all.

More specifically, known arrangements for controlling exposures in regard to a plurality of sub-fields require that each interior and exterior rectangle be assigned to a specific sub-field. If a rectangle cannot all be written from a single sub-field plus its sub-field extension, the rectangle must be cut into a series of smaller rectangles. This can be visualized with reference to FIG. 3 which is an enlarged portion of FIG. 2 in the vicinity of dashed line 20 which represents a location of a boundary between sub-fields. The limit of the sub-field extension of the sub-field to the left in FIG. 3 is indicated by chain line 32. The limit of the sub-field extension of the sub-field to the right in FIG. 3 is indicated by chain line 30. The boundaries of rectangles I, III, V and VI are indicated by heavy lines and the rectangles are further divided into maxspot and remainder rectangles as in FIG. 2b.

It can be seen that the right edge of rectangle I lies outside the sub-field in which the majority of the rectangle lies. However it can be written entirely from the left sub-field. Alternatively, rectangle I could be cut at any maxspot boundary 21, 23, 25 and the right end of rectangle I could then be written from either or both sub-fields. Additionally the leftward extent to rectangle I may be sufficiently great as to cross further sub-field extension boundaries, requiring further cutting.

Rectangle III lies entirely in the sub-field to the right of sub-field boundary 20. However, since it also lies to the left of sub-field extension boundary 32, the entirety of rectangle III could also be written from either or both sub-fields. Rectangle V lies entirely in the same sub-field as rectangle III but crosses a sub-field extension boundary. Therefore, rectangle V can only be written from the sub-field to the right of FIG. 3.

It should be noted that a single division of a rectangle does nothing toward compensating for errors of occlusion between sub-fields. Therefore, to provide such compensation, rectangle I would be typically divided into a plurality of rectangles, each of which will be written at full dose or greyed dose levels from each of the sub-fields. It should also be noted, as briefly referred to above, that the grey-splicing process will be carried out only on exterior rectangles to reduce processing overhead although division of interior rectangles will be done in a similar manner. In any overlap of rectangles involving at least one interior rectangle, the interior rectangle can be done at full dose since any resultant blooming will be contained within the shape outline sleeved by the exterior rectangles.

In order to understand in detail how rectangles are divided and assigned to particular sub-fields for control of e-beam exposure including greying, a known method of grey-splicing will now be discussed. One such methodology comprises the following steps:

1. Assign any rectangle that can be written from one sub-field to the sub-field (e.g. the sub-field and its extension) where the majority of the rectangle lies. If a rectangle is too large to be written from one sub-field, divide it into pieces, nominally along sub-field boundaries, which can each be written from a single sub-field and assign each piece to the sub-field it resides in.
2. Sort rectangles by x- and y-location and place the rectangles into a queue.
3. For each rectangle in the queue, find all abutting (e.g. contiguous) rectangles. Then, for each rectangle abutting another neighbor rectangle,
   If the neighbor rectangle is assigned to the same sub-field as the queue rectangle, no action is taken, If the neighbor rectangle is assigned a different sub-field than the queue rectangle, and the borders align exactly, then adjust border of the rectangles such that the left (or top) rectangle is a multiple of the maxspot and perform greying on the overlapping area. This is illustrated in FIG. 4a.

If the neighboring rectangle and the queue rectangles align such that the abutting edge of one rectangle spans (e.g. contains) the other, overlap the smaller edge into the larger edge by a user specified distance at full dose. In this case, blooming of the overlapping shorter edge will be substantially contained within the rectangle having the longer edge. This is illustrated in FIG. 4b.

If the neighbor rectangle and the queue rectangle align such that neither edge fully contains the other, no action is taken. This is illustrated in FIG. 4c.

4. Repeat for each neighbor of the queue rectangle. END for queue rectangle.

4. Repeat for each rectangle in the queue.

It is to be understood that the locations of abutting edges in the foregoing methodology are described in terms of ideal, intended locations of rectangles in the vicinity of ideally contiguous edges of adjacent sub-fields. Therefore, no gap between adjacent rectangles exists in this ideal description and the overlap provided in some cases is intended to compensate for errors of occlusion between sub-fields when the exposure is actually carried out.

Although the above methodology has produced good results in many situations, two problems have occurred which are attributable to this methodology. First, in some cases where no action is taken and others, if the occlusion error is large, separation of rectangles may, nevertheless, occur. Second, when overlap is performed at full dose, blooming will be produced in the area of the overlap. In some cases, overlap at full dose may be tolerable as will be discussed below with reference to FIG. 4b. However, when overlap occurs due to occlusion errors, blooming will be produced which causes edge resolution to be lost and may result in a defective pattern.

The result of various errors of occlusion are illustrated in FIGS. 4a'-4c' and 4a"-4c". For purpose of discussion of these Figures, it is irrelevant which rectangle is the queue rectangle and which is the neighbor rectangle, the dimensions of which are labelled Q and N.

Specifically, if the occlusion error causes the sub-field to overlap, the conditions of FIG. 4a would cause excess exposure in the cross-hatched area of FIG. 4a' and blooming 41 would result in the location shown. Similarly in the circumstances of FIG. 4b where the overlap by a user selectable distance yielded little or no blooming in areas 43, the increased overlap of sub-fields would cause blooming 41 to occur. (Note that the overlapped region of the narrow rectangle is exposed at full dose from both sub-fields) Conversely, an occlusion error causing separation of sub-fields, under the circumstances of FIG. 4a would yield an acceptable pattern unless the occlusion error was very large as shown in FIG. 4a" (separation in the finished product may be greater than the gap shown since the abutting edge areas of the rectangles receive a greyed exposure dose. However, under the circumstance of FIG. 4b, where the distance d is user selectable to minimize blooming at proper occlusion, separation could more easily result as shown in FIG. 4b".

Under the circumstances of FIG. 4c, where no greying or alteration of rectangle dimensions is done and overlap of sub-fields causes an overlap of rectangles, blooming 41 occurs, as indicated. If occlusion error causes separation of sub-fields, separation of rectangles occurs.

Therefore, it is seen that the prior art greying methodology yields acceptable results only in one of the six possible occlusion error/greying scenarios, assuming the occlusion errors are greater than d but less than the maxspot dimension. In fact, this methodology is viable only because the blooming of FIG. 4b' will seldom be significant to the pattern since it occurs on inside corners of the pattern (conversely, d can be made somewhat larger and some blooming tolerated in order to reduce the frequency of separations), and because the juxtaposition of rectangles shown in FIG. 4c is relatively rare in actual designs.

In summary, whenever the prior art provides some compensation for occlusion errors between sub-fields in order to reduce the frequency of occurrence of patterning separations, a risk of blooming of portions of the pattern is engendered.

SUMMARY OF THE INVENTION

It is therefore an object of the present invention to provide a method and apparatus for developing grey-splices which eliminates double exposure at full of exterior areas of a desired pattern while minimizing the possibility of discontinuities of exposure.

It is another object of the invention to provide a grey-splicing arrangement and process which has increased throughput and which can develop grey-splices at increased speed.

It is a further object of the invention to provide for optimum operation of an e-beam exposure system by minimizing the number of exposure spots used to produce grey-splices.

In order to accomplish these and other objects of the invention, a method and system for producing grey-splices is provided in a pattern exposure system in which the writing area is divided into sub-fields and a desired pattern is represented by a plurality of non-overlapping rectangles, including the steps of determining ones of the rectangles which are wholly or partly included in a sub-field overlap zone, dividing the sub-field overlap zone into sections, examining each section to determine at least the number of exposure spots required to form portions of said rectangles which are in said sub-field overlap zone, selecting a section, and greying at least one said exposure spot in said section.

In accordance with another aspect of the invention, a data structure is provided containing, for each section of a sub-field overlap zone of a writing area of an electron beam exposure apparatus, a table including at least a number of spots required to form portions of a desired pattern which traverses said sub-field overlap zone.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is an enlarged portion of FIG. 2 and illustrates the criteria for division of rectangles for writing from one or two sub-fields in connection with the overlap zone of two adjacent sub-fields, FIGS. 4a, 4b, 4c, 4a', 4b', 4c', 4a'', 4b'' and 4c'' illustrate the operation of an exemplary prior art grey-splice methodology.

DETAILED DESCRIPTION OF A PREFERRED EMBODIMENT OF THE INVENTION

Figure 5:
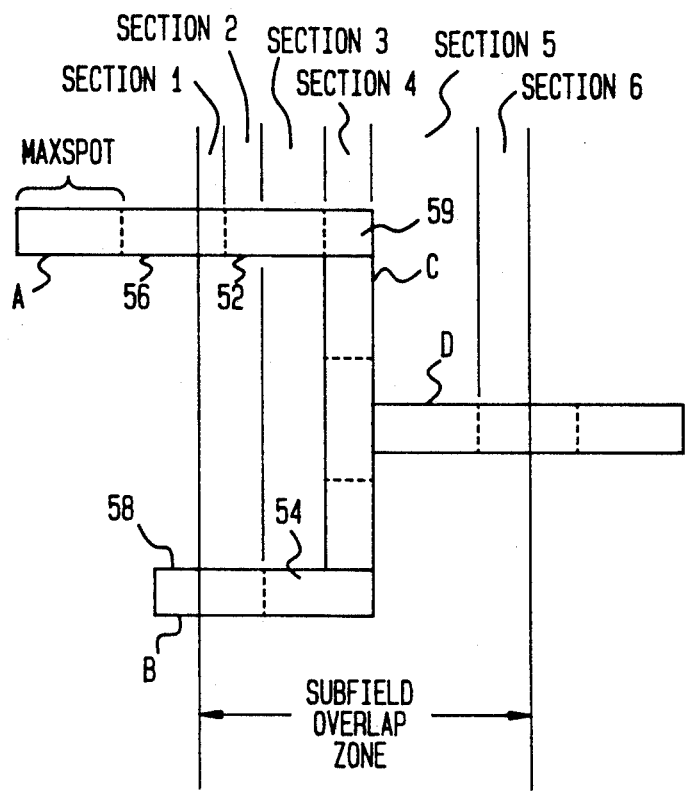
FIG. 5 illustrates an example of the operation of the invention, FIG. 6 schematically illustrates a greytable list in accordance with the present invention.

Referring now to the drawings, and more particularly to FIG. 5, there is shown an example of an exposure of a pattern crossing a sub-field overlap zone which will be discussed by way of introduction to the invention. The pattern shown in FIG. 5 show four non-overlapping, elongated rectangles A, B, C, and D, indicated by solid lines, each of which is tiled with spot rectangles indicated by dashed lines crossing the width of the elongated rectangles. Most of the spot rectangles are of maxspot size tiled into the pattern from left to right and top to bottom. Therefore, the rightmost spot of rectangle A and the lower-most spot of rectangle C contain remainder spots which are less than maxspot size in the direction of the long dimension of the respective rectangles in which they reside.

At the outset, it is important to understand that it is assumed that the exposure system which is to be controlled in accordance with the invention is capable of exposing a series of contiguous spots with sufficient accuracy within a sub-field that no unintended separations will occur within a single sub-field. The mechanism by which this is done is substantially irrelevant to the invention which is concerned only with greying to insure that no unintended separations occur when a pattern traverses a boundary between sub-fields.

It is also important to keep in mind that the underlying rationale of the invention is to pick a portion of the pattern to grey which is most favorable to the production of a grey-splice which will exhibit neither blooming nor separation even when occlusion errors may be as severe as a substantial fraction of the maxspot size. It is also important to understand that a single spot is the minimum area which can be greyed and that the greying process is performed equally over the entirety of the portion of the pattern chosen for greying. The greying process entails the writing of the spot or spots of the pattern portion chosen for greying from two adjacent sub-fields. Therefore, even though spots may be written in sequence with extreme speed, each greyed spot represents a duplication of spots from each of two sub-fields and thus slows operation of the exposure system.

Since the minimum greyable area is a single spot, the portion of the pattern to be greyed must be a section of the pattern defined at spot boundaries. Accordingly, FIG. 5 shows six sections, the boundaries between which correspond to spot boundaries within one of rectangles A, B, C or D. For example, the boundary between sections 1 and 2 corresponds to a spot boundary in rectangle A while the boundary between sections 2 and 3 corresponds to a spot boundary in rectangle B. Also, only areas within the sub-field overlap zone can be written from the necessary number of sub-fields and it is only necessary to define sections within the sub-field overlap zone. However, not all sections within the sub-field overlap zone may be ideally greyable for any one of a number of reasons, generally involving the magnitude of occlusion error which would be compensated if that section were greyed. For example, the most significant reason for determining that a section is not ideally greyable is that a spot which does not fall completely within the boundaries of the sub-field overlap zone cannot be fully written from both sub-fields. The portion of the spot which could not be written represents a potential pattern defect since is would be less than fully exposed, if greyed, even if no occlusion error were present. The foreshortened portion of the spot which could not be written from both sub-fields also represents a reduction of the size of the occlusion error which could be compensated. Another example would be a section which included a remainder spot (e.g. necessarily less than maxspot size in a direction transverse to the axis of the sub-field overlap zone). In this case, the foreshortening of the remainder spot from the maxspot dimension would also reduce the occlusion error which could be compensated.

Therefore, the underlying approach of the present invention is to define a chain of rectangles within which greying must be done, divide the width of the sub-field overlap zone into sections which are potentially greyable, examine the spots within each section to evaluate the properties of the pattern and spots wholly or partly contained in each section and determine which section is the best candidate for greying. Once the section which is the best candidate for greying is determined, all spots which lie wholly or partially within that section are greyed. For example, if section 3 were chosen to be greyed, both spots 52 and 54 would be greyed even though both extend beyond the boundaries of section 3. It should also be noted that it is possible that none of the sections within the sub-field overlap zone may be ideally greyable and the ultimate default of the system according to the invention is the centermost section.

Figure 6:
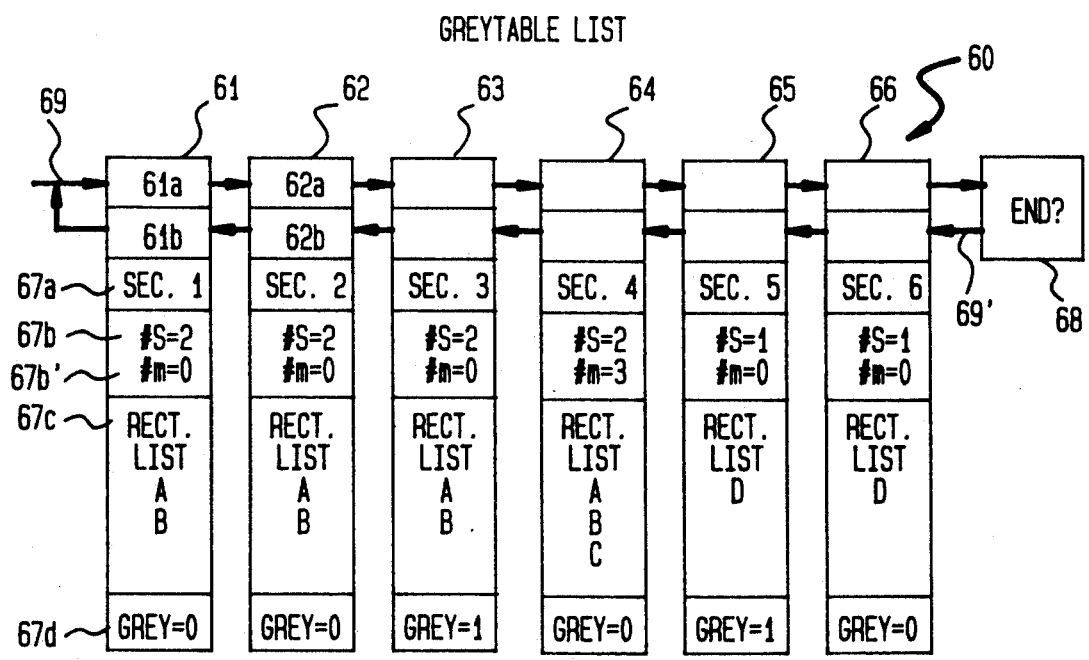

The evaluation of the pattern and spots of a section is facilitated, in accordance with the invention by the use of a greytable list, schematically illustrated in FIG. 6. As each section is defined in accordance with the spot boundaries in FIG. 5, entries are made in a table list entry, such as table list entry 61, corresponding to that section, within the greytable list 60. These entries consist of information which is easily obtainable from the rectangle information defining the pattern to be produced and a very few such pieces of information are sufficient for evaluation of the spots wholly or partly contained in each of the sections.

Specifically, each table list entry 61–66 contains an identification of the section number 67a, a count of the number of spots in each of two categories 67b, 67b', a list of rectangles involved in the formation of the portion of the pattern within the zone 67c and a bit to indicate whether or not the section is ideally greyable. To convey an understanding of these entries in the table list entries 61-66 of greytable list 60, each section of FIG. 5 and the corresponding entries indicated in FIG. 6 will be considered in turn. In the following discussion, the entries #s and #m are of particular importance. The entry #s is the number of single spots which are sufficient to form the portion of a given rectangle within a particular section. The entry #m is the number of spots needed to form a portion of a particular rectangle in a section when the rectangle must be written with multiple spots (e.g. more than one maxspot since the rectangle will be tiled beginning with a maxspot, if possible) within the section.

The sections extend in the same direction as the subfield overlap zone but are of reduced width (e.g. equal to or less than the split distance). Thus, section 1 cuts across two rectangles A and B, which are identified in rectangle list 67c of table list entry 61. Since each of these rectangles is only one spot wide (e.g. less than the split distance) that part of each of these rectangles falling within section 1 is formed by a single spot and #s is set equal to 2 at entry 67b. No rectangle is present in section 1 which requires more than a single maxspot and #m is set equal to 0 at entry 67b'. Since both spots 56 and 58 extend across the boundary of the field overlap zone, the section is not ideally greyable and entry 67d is set to 0 or "no". Entries for section 2 in table list entry 62 are the same as in table list entry 61 even though the spot 52 of rectangle A now lies fully within the sub-field overlap zone and is thus theoretically greyable. It is sufficient for purposes of the invention to determine that section 2 is not ideally greyable if any spot forming a portion of a rectangle in the section crosses the boundary of the sub-field overlap zone, as is the case with spot 58.

In contrast, while section 3 also involves only rectangles A and B and the same number of single spots, #s=2 (notwithstanding the fact that section 3 is wider than section 1 or section 2). Section 3 is considered ideally greyable since the portions of rectangles A and B falling within the section are maxspots 52, 54 falling within the sub-field overlap zone and a 1 or "yes" is entered in table list entry 63 as the grey flag (corresponding to entry 67d of table list entry 61).

Section 4 is quite different since it includes three rectangles A, B and C as indicated in the rectangle list (corresponding to reference numeral 67c of table list entry 61) of table list entry 64. The number of single spots, #s remains 2 to reflect the single spots required for rectangles A and B but the number of multiple spots, #m is 3 to indicate the number of spots (maxspot and remainder) which are required for rectangle C. The grey flag is set to 0 in table list entry 64 since greying of this section would require greying of at least one spot 59 which is less than a maxspot. Therefore the section is not ideally greyable since the greying of a spot smaller than a maxspot would correspondingly reduce the maximum occlusion error which could be compensated. It should be noted that this condition is relatively common and similar pattern portions could prevent a large number or even all of the sections to be considered not ideally greyable.

Sections 5 and 6 involve only rectangle D which can be formed with only a single spot in either section and, of course, no multiple spots are required. The grey flag of table list entry 65 is set to 1 since section 5 is ideally greyable. However, section 6 is not ideally greyable since the maxspot partially falling within section 6 crosses the boundary of the sub-field overlap zone in a manner similar to spots 56 and 58 in sections 1 and 2. It should be noted that if the spot in section 6 terminated at or within the sub-field overlap zone, it would still not be ideally greyable since it would be less than a maxspot size. On the other hand, greying would then be moot for this latter case since all spots could be written from the left sub-field and no grey-splicing would be required between the sub-fields.

Once this data has been entered in the respective table list entries of the greytable list 60, it is a very simple and quick process to examine each of the table list entriess 61-66 in turn in order to pick the best candidate section for greying. Specifically, the first table list entry 61 is initially assumed to be the best candidate and thereafter each further table list entry is examined in turn to determine whether the grey flag bit is a 1 and, if so, whether the number of rectangles, and the #m and #s quantities are smaller than corresponding quantities of the best previously examined list. Each time a better greyable portion is found, it is stored for purposes of controlling the greying process, as will be discussed in greater detail below, particularly in connection with FIG. 12. In this case, two sections are ideally greyable and between section 3 and section 5, section 5 would be chosen by comparing the number of rectangles and the values of #m and #s. It should be noted that section 5 represents the best possible combination of characteristics requiring only one single spot to be greyed and, since a spot less than a maxspot would cause the grey flag bit to be set to 0, the spot involved in zone 5 has been recognized as a maxspot. It is also recognized as extending for a maxspot dimension in the direction transverse to the direction of the sub-field overlap zone since only one single spot is required, as can be deduced because of the right-to-left and top-to-bottom tiling sequence.

If such an optimum choice were not present among the ideally greyable sections, the order of preference would be the minimum number of rectangles, the minimum #m in any rectangle in the section or portion and the minimum #s among sections reporting equal #m. It should be noted that this order of preference not only assures that the greatest possible dimension of occlusion error which can be compensated will be maintained but also assures most efficient possible operation of the exposure system since the number of spots which are produced from more than one sub-field will be minimized.

It should also be noted, as will be discussed in greater detail below, that the construction of the greytable list is preferably done by starting with only one initial section and subdividing that section as necessary to carry out the process. To facilitate the maintaining of an ordered list when this is done, it is preferable to provide two pointers in each table list entry to point to the address of preceding and following sections, thus forming a bi-directional linked list. For example pointer 61a points to the address of table list entry 62, 62a points to the address of table list entry 63, ..., pointer 62b points to the address of table list entry 61, as does pointer 61b. This allows traversing through the individual table list entries in order to determine the section where a particular boundary between maxspots falls when division of a section is required at that point.

With the above overview in mind, the operation of the invention will now be described in detail with reference to the flow chart of FIGS. 7-9, At the start of the operation of the invention, it is assumed that the desired pattern will already be specified as a plurality of non-overlapping rectangles with start and end points specified for each rectangle with respect to the entire writing area. These descriptions of the rectangles will exist in an ordered list in accordance with a predetermined tiling order convention (e.g. left to right and top to bottom). The process is divided into three basic portions, each illustrated in a respective one of FIGS. 7, 8 or 9. It may also be helpful to note that each of the first and second portions of the process contain steps for evaluating the rectangles with a view to eliminating as many rectangles as possible from further processing. This feature allows the process to be carried out far more expeditiously by minimizing the number of steps carried out in regard to any particular rectangle in the desired pattern.

A description of a first (or next) rectangle is obtained from the list of rectangles defining the desired pattern at 110 and first evaluated at 112 to determine if any part of the rectangle touches or lies in a sub-field overlap zone. This may be done by merely comparing the addresses of start and end points of the rectangle in both coordinate directions with the locations of sub-field boundaries and the dimension of the sub-field extension or, more simply, the start and end points of the sub-field overlap zones, using a digital address comparator arrangement similar to that schematically illustrated in FIG. 10. If not, the rectangle lies completely within a sub-field and no part of the rectangle can be written from any other sub-field. Therefore, a sub-field number may be immediately assigned at 120 and the rectangle written to the output list at 122. The process then loops through 124 to obtain the next rectangle from the list or determine completion of the first portion of the process.

If a part of the rectangle touches or lies in a sub-field overlap zone, a further test is made at 114, preferably by address comparison, to determine if the entire rectangle can be written within the area of a sub-field and its extension. If so, the rectangle is immediately written to a sort list at 118 for further processing in accordance with a second portion of the process in accordance with the invention.

It should be noted that the rectangles are written to different lists in dependence on the result of test 112. The reason for this distinction is that a rectangle which is so far from the boundary of a sub-field that it does not touch the extension of another sub-field cannot be written from any sub-field other than the one in which it lies and thus does not require processing as part of a chain which contains a greyable portion. The practical effect of this distinction is that by writing rectangles satisfying the test of 112 directly to the output list, the chains are limited to groups of rectangles which actually traverse a boundary of a sub-field overlap zone. While a resulting rectangle or chain may traverse a plurality of overlap zones, the limitation of chains to those which do not contain rectangles which touch or overly any part of a sub-field overlap zone has been found in practice to greatly increase the efficiency and throughput of the process according to the invention by simplification of the chains considered in the second part of the process.

If the rectangle cannot be entirely written from a single sub-field, as determined at 114, it is divided into pieces at some essentially arbitrary maxspot boundary within the sub-field overlap zone at 116. This results in two pieces each of which can be written from a single sub-field. These pieces are then written to the sort list, as rectangles, at 118, as before. It should be noted that the development of chains of rectangles in the second part of the process according to the invention is largely the inverse of this division process and substantial efficiency can be achieved by maintaining pointers to other pieces when a division is made. Once these rectangles or pieces have been written to the sort list, the process loops through 124 as before or exits this portion of the process when all input rectangles have been considered.

When the input list of rectangles has been exhausted, the process sorts the rectangles into chains at 126. The following steps of this process will be discussed in detail with reference to FIG. 8. First, at 130, the sort list is interrogated to determine if rectangles are present therein. This test merely provides for an eventual exit from the process when it is complete. If one or more rectangles are present in the sort list, a description of a next rectangle (p_next) is fetched from the sort list at 132, in an order proceeding, as before, from left to right and top to bottom through the sub-fields of the writing area. Then a chain is found which includes p_next at 134 by address comparison of start and end points of rectangles in the sort list and/or by evaluation of pointers of rectangles divided in step 116. This process can be conducted at high speed since only a limited range of addresses of start and end points need be considered. As indicated above, such chains will be limited in length and will contain all contiguous rectangles of the desired pattern which lie between a termination within the sub-field overlap zone, if any, and a boundary, outside the sub-field overlap zone, of a rectangle which traverses the boundary of the sub-field overlap zone. Thus, the chains are limited to rectangles in which greying could potentially be conducted.

By address comparison, as before, the chains are tested at 136 as to whether or not the entire chain could be written from one sub-field. If so, that sub-field is assigned to each rectangle in the chain at 140 since that chain, according to the test, does not traverse the entire width of the sub-field overlap zone. Then, since the sub-field has been assigned, each rectangle can be written to the output list at 142 and removed from the sort list at 144. It should be noted that this procedure allows a plurality of rectangles to be processed together and removed from the sort list in groups, whether or not greying is done, in order to expedite the execution of the process. When the evaluation of each chain is complete, the process loops back to 130, a next rectangle fetched and another chain containing that next rectangle is developed and evaluated by repeating the process until no more rectangles remain in the sort list.

If, and only if, the chain completely traverses a sub-field overlap zone, as determined at 136, is greying carried out at 138 which will now be discussed in detail with reference to FIG. 9. The greying process essentially comprises two nested loops 150 and 160. Loop 150 is of importance only when a chain traverses more than one sub-field overlap zone. Each time the greying process is begun at 152 with respect to a particular sub-field overlap zone, the greytable list is initialized to one table list entry (e.g. 61 of FIG. 6) and that table list entry is marked as greyable. For each chain, each sub-field overlap zone which is traversed will be considered and greyed in turn by the process indicated by dashed line 160.

The greying process for rectangles which lie wholly or partly within the sub-field overlap zone under consideration essentially comprises division of the sub-field overlap zone into sections in accordance with maxspots of the individual rectangles and generation of corresponding table list entries in the greytable list 60 by dividing and updating the initial table list entry. Then the sections represented by the respective resulting table list entries are compared and a most favorable or default section selected for greying.

Specifically, after entering the greying process at 162 and testing for completion of the process as to a given zone at 164, each maxspot boundary within a first rectangle is examined at 166 to determine which of these boundaries represent a change of criteria which would indicate a change from an ideally greyable maxspot to a non-greyable maxspot, indicating a change from a greyable to non-greyable portion of the rectangle. The rectangle is considered to be divided at each point where such a change in criteria is observed. The address of each maxspot boundary representing such a change is then processed against existing table list entries of the greytable list at 168 and new table list entries generated, maintaining pointers to preceding and succeeding table list entries. The divided portions are evaluated and corresponding data (#s, #m, the rectangle list and the grey flag) entered in corresponding table list entries of the greytable list at 170. When the table list entries have all been updated as to the divided portions of the rectangle, the process loops back to 164 to repeat the process for another rectangle until all rectangles in the chain and lying wholly or partly within the zone have been considered and appropriate table list entries generated in the greytable list.

Figure 9:
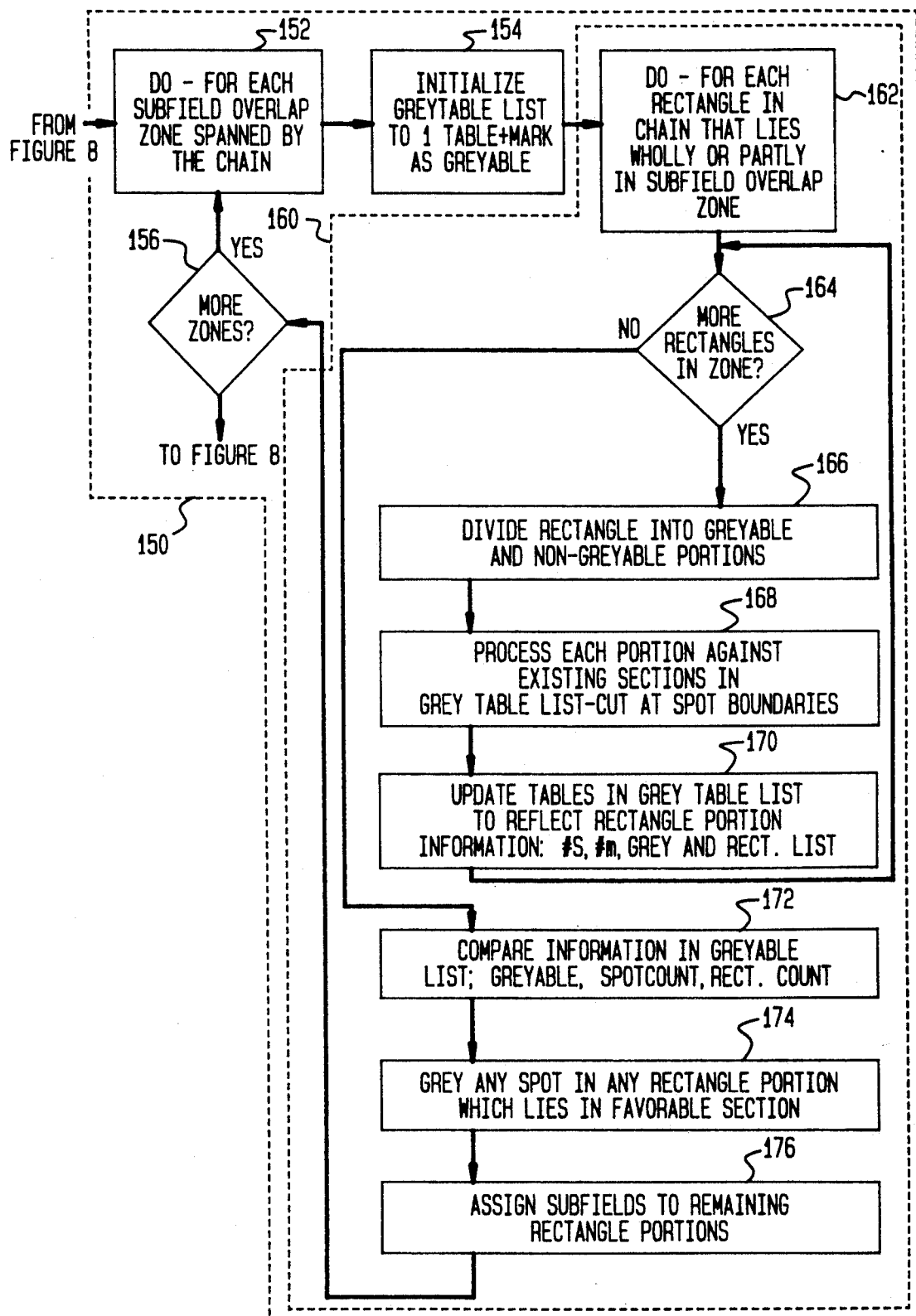

When no more rectangles remain to be processed in the zone, the greytable list may be evaluated as discussed above with regard to FIG. 6 by steps 172 of FIG. 9. Once the most favorable section of the sub-field overlap zone has been selected at 172, the portion of any rectangle which lies in the most favorable portion will be greyed. This essentially requires only that the spots corresponding to that portion will be written to both contiguous sub-fields and a flag set for that portion in each rectangle to write that area at the desired reduced intensity to produce the grey splice. Finally, single sub-fields are assigned to the remaining rectangle portions based on the relative position of each respective portion to the grey splice portion.

By testing for more zones at 156, the above-described process may be repeated for other sub-field overlap zones traversed by the chain. It should be noted in this regard that if only one sub-field overlap zone is involved, greying will be complete as to the addresses of the rectangle portions to be greyed. When no more sub-field overlap zones are found for the chain under consideration, the process returns to 142 of FIG. 8.

Figure 1:
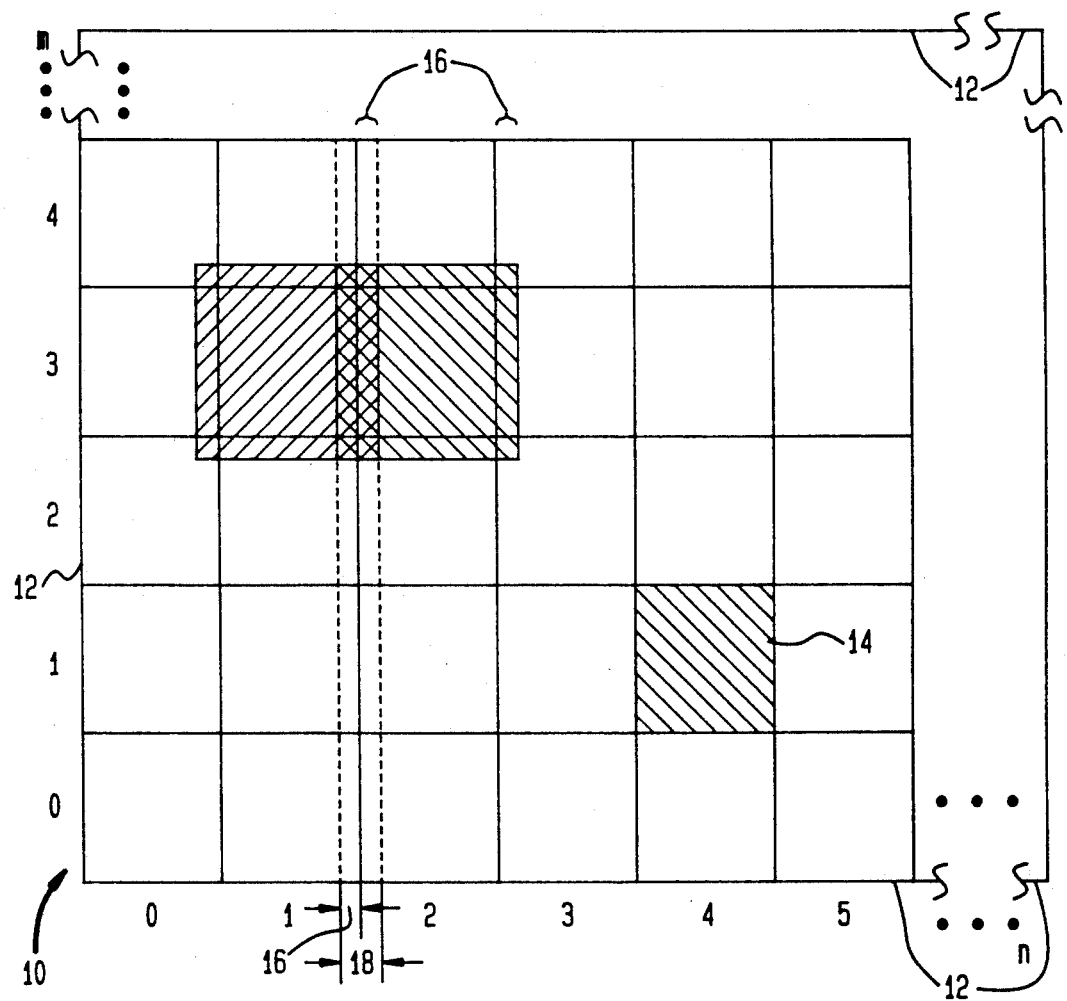
FIG. 1 is an illustration of the relationship between the writing area and sub-fields.
Figure 2A:
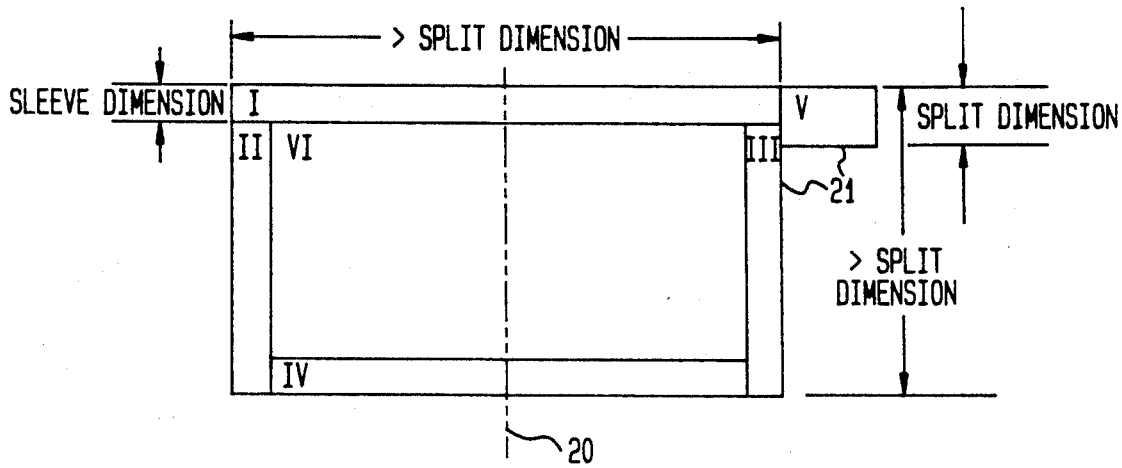
FIG. 2a illustrates an exemplary tiling of an arbitrary shape with rectangles.
Figure 2B:
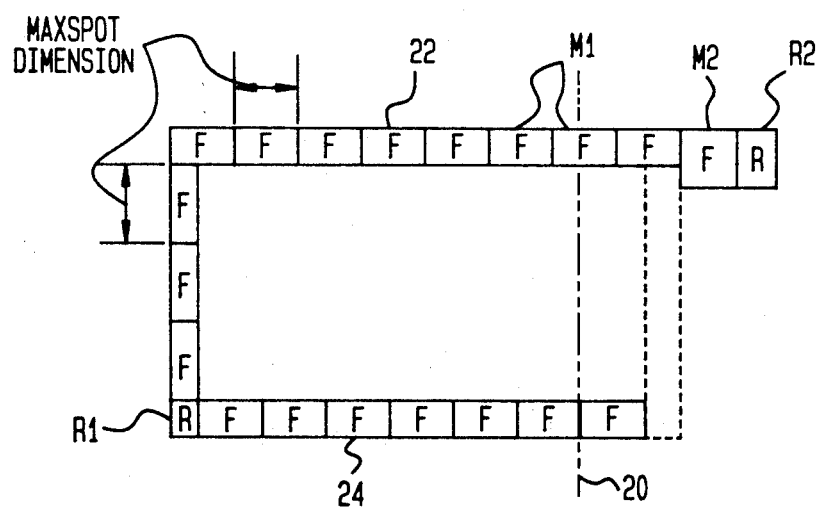
FIG. 2b illustrates tiling of the exterior rectangles of FIG. 2a with spot rectangles.

Prior art grey-splice techniques have been typically carried out with a general purpose digital computer. Therefore, such an implementation is advantageous for the invention because such an implementation will allow the invention to be retrofit into existing e-beam exposure systems. Accordingly, the preferred pseudocode which will allow a skilled programmer to implement the invention in such an environment is as follows:

* For each rectangle in input list;
  @ If the entire rectangle can only be addressed exclusively from one sub-field and does not touch an x or y sub-field overlap zone then assign that rectangle the exclusive x and y sub-field number and write it to output list.
  @ If a rectangle can all be written from one sub-field but part or all lies in or touches either an x or y sub-field overlap zone, assign a temporary x and y sub-field number based on where the majority of the shape lies. Also label the rectangle in both the x and y directions whether the rectangle enters a unique x/y sub-field overlap zone, leaves a unique x/y sub-field overlap zone, is mutual to (totally contained within) a unique x/y sub-field overlap zone, or is exclusive to (no part touches or is in) a unique x/y sub-field overlap zone. Write this rectangle to sort.
  @ If a rectangle cannot be written all from one sub-field, then divide the rectangle at a maxspot interval nearest each nominal sub-field boundary between adjacent sub-fields that this rectangle must be written from. Assign each piece of the rectangle an x and y sub-field number and label the rectangle in both x and y directions in a similar fashion as they were labeled in the previous step.
    NOTE: By definition of the creation of the exterior rectangles for sleeving, only one dimension will be large enough for possible cutting.
  Write each piece of the rectangle to sort.
* End for processing each rectangle in input list.
* Sort rectangles written to sort in the following order:
  y sub-field number increasing,
  x sub-field number increasing,
  Lower x coordinate increasing,
  Lower y coordinate increasing,
* From exit of sort place all rectangles into an unassigned list (permanent x and y sub-fields have not been assigned yet).
* Do until unassigned list is empty;
  @ Get the next rectangle inthe unassigned list (P-nest-rect)
  @ Searching through the unassigned list find the "chain" of rectangles (a chain is defined as the series of rectangles(s) that connect to any rectangle in the chain) that has P-next-rect as an element.
  @ If this chain can be written entirely from one sub-field, than assign sub-field numbers to each rectangle in the chain the x and y sub-field where the majority of the chain lies.
  @ If chain has unassigned y sub-fields then call grey(y)
    ELSE;
  @ If chain has unassigned x sub-field then call grey(s)
    ELSE;
  @ Write each rectangle in chain to output list
  @ Remove all rectangles in chain from unassigned list
* End do until unassigned list is empty
* Grey: Proc(Direction) /*Direction = x or y @ Set P-next to first rectangle in chain;
  @ Do for each rectangle in chain;
    If (P-next already has its direction sub-field assigned) or (P-next is labeled mutual in direction) then;
    ELSE
    If P-next labeled exclusive in direction then
    DO;
    Assign direction sub-field to P-next-this value = (direction mid-point of rectangle)/sub-field dimension -continued
```
                    END;
                    ELSE
                    Do;/* P-next is either enter or leave
                        If (P-next is labeled enter in
                            direction) then
                    DO;
                    Find direction sub-field overlap zone
                    P-next enters, remove enter label from
                    P-next
                    END;
                    ELSE
                    DO; /* P-next is labeled leave in
                    direction */
                    Find direction sub-field overlap zone
                    P-next leaves, remove leave label from
                    P-next
                    END,
                    Find the "sub-chain" of rectangles (a
                    sub-chain is defined as the series of
                    rectangle(s) that connect to any rectangle
                    in the sub-chain and lies partly (or
                    touches) or entirely within the direction
                    sub-field overlap zone) that has P-next as
                    an element.
                    If (sub-chain does not enter and leave the
                    direction sub-field overlap zone) then
                    assign direction sub-field numbers to
                    sub-chain rectangles based on whether the
                    sub-chain enters or leaves the direction
                    sub-field overlap zone.
                    ELSE
                    Call grey-sub-chain;
                    END; /* end P-next is either enter or
                    leave */
                    If P-next is labeled enter or leave then;
                    /* loop repeated for P-next *
                    ELSE
                    P-next = next rectangle in chain. *
                    End do for each rectangle in the chain;
*       End grey (direction)
*       Grey-Sub-Chain: Proc;
        /* This subroutine will grey rectangles in
            the sub-chain list. Since greying will
            increase the rectangle and spot count, we
            will attempt to minimize this increase if
            possible. By the use of a grey table list
            (defined below), we can examine different
            potential grey locations for the best
            choice. */
DCL 1   Grey table, /* element in grey table list */
        3 next PTR, /* pointer to next entry */
        3 prev PTR, /* pointer to previous entry */
        3 section, /* corresponds to that part of
            5 low fixed  the sub-field overlap
            5 high fixed zone that low and high
define */
        3 # shapes,
            5 #s.spots fixed
            5 #m_spots fixed
                    /* contains the number of
                        rectangles that have a
                        portion of themselves
                        in this section.
                    #s-spots = #rects that would
                    need only one spot grey
                    #m-spots = #of spots that would
                    have to be greyed from non-one
                    spot rectangles through this
                    section
                    (i.e., one spot rectangles are
                    horizontal rectangles for x
                    greying, vertical rectangles
                    for y greying.)
        3 List-of-rects PTR,
                    /* Pointer to the list of
                        rectangles that lie partly or
                        entirely in this section*/
        3 Greyable fixed;
                    /* 1 - this section has only
                        rectangles that:
                        - If direction distance
                            less than maxspot then
                            the entire rectangle fits
                            within the sub-field
                            overlap zone.
                        - If direction distance
                            greater than or equal to
                            maxspot - a maxspot spot
                            of the rectangle passes
                            through section and that
                            maxspot lies entirely
                            within the sub-field
                            overlap zone.
                    O - If this section contains
                        any rectangles that don't
                        fit the above criteria */
*   Initialize the grey table list to one entry
    being the entire sub-field overlap zone. Set
    this entry to have its greyable components = 1.
*   Do for each rectangle in sub-chain
    @ Determine the tool's spot breakup for this
        rectangle (an example appears in FIG. 2)
    @ Determine the greyable and non-greyable
        portions of this rectangle inside of the
        direction sub-field overlap zone. A
        greyable portion is any maxspot spot of
        this rectangle that lies totally within
        the direction sub-field overlap zone. A
        non-greyable portion is any remainder size
        spot, or part of a maxspot size spot that
        only lies partly within the direction
        sub-field overlap zone. If a rectangle's
        shorter dimension lies entirely within the sub-field
        overlap zone or the rectangle can be written with
        one spot then the rectangle's one protion is called
        greyable.
        NOTE: Non-greyable portions still can be
        greyed but greyable portions lead to
        more optimal grey rectangle count.
    @ Store all the greyable and non-greyable
        portions for this rectangle in the grey
        table list.
            Greyable and non-greyable portions
            are processed against the existing
            entries in the grey table list.
            These new portions are compared with
            existing entries for any overlap. An
            input portion may have some overlap
            with one or multiple entries already
            stored in the grey table list. The
            input portion is processed against
            each entry in the grey table list
            that has some overlap with it. For
            each entry one of the following
            comparisons will be true:
        Based on the comparison between the grey
        table entry and the input portion do the
        following (each case is illustrated in
        Table I of FIG 13):
            Case 1:
            Add to grey table entry #s-spots
            or #m-spots depending on the
            input portion.
            Add input rectangle to list-
            of-rects for this grey table
            entry.
            If input portion greyable then;
            ELSE
            set grey table entry greyable = 0
            Case 2 & 3:
            Create two entries in the grey
            table list in place of the
            existing entry based on the
            endpoint (Case 2) or start point
            (Case 3) of the input portion.
            Copy the existing grey table
            information (# shapes,
            list-of-rects, greyable) to the
            new entry created. As in Case 1
            add the input portion
            information to the grey table
            entry that the input portion now
            aligns with.
```

```
                    Case 4:
                      Create three entries in the grey
                      table list in place of the
                      existing entry. Based on the
                      endpoints of the input portion,
                      copy the existing grey table
                      information (# shapes,
                      list-of-rects, greyable) to all
                      of the entries created. Add the
                      input portion information to the
                      grey table entry that the input
                      portion now aligns with.
        @ End do for each rectangle in sub-chain
/*  At this point all the grey information about
    the sub-chain with respect to this direction
    overlap zone is stored in grey table list. Our
    goal is to find the best entry in the list and
    perform the grey on all the rectangles in its
    list-of-rects. We can also help minimize the
    total number of rectangles
    and spots that have to be written by the
    tool (would aid in tool's throughput) by
    choosing the entry, if possible, that has
    the fewest #m-spots and #s-spots and
    greyable = 1. The greyable part of each
    grey table entry tells us if any rectangle
    through this section could possibly have
    an unfavorable cut for greying.
*/
        @ P-entry = First entry in grey table list;
        @ P-best-entry = P-entry;
        @ Do for each entry in grey table list;
              If P-entry has better # shapes criteria
              (#s-spots, #m-spots) and a favorable
              greyable (Greyable = 1)
              THEN
                P-best-entry = P-entry;
              ELSE;
                P-entry = next entry in grey table list;
        @ End do for each entry in grey table list;
/*  At end of loop P-best-entry is the entry in
    grey table list that will be greyed. Each
    rectangle in P-best-entry list-of-rects will be
    greyed over the point (P-best-entry list-of-rects will be
    greyed over the point (P-best-entry . Low +
    P-best-entry . High)/2 . Each rectangle in the
    P-best-entry list-of-rects and any new grey
    rectangles produced will have grey overlap
    created and direction sub-field assigned.
*/
/*  If at the end of the loop P-best-entry greyable = 0
    then we would choose the grey table entry
    that spans the nominal sub-field boundary of
    the sub-field overlap zone as the
              entry to grey. Each rectangle in that
              entry would be greyed over the nominal
              sub-field direction value. */
/*  For all other entries in grey table list
    (excluding P-best-entry); assign the direction
    sub-field number to all rectangle(s) in their
    respective list-of-rects list (that have not
    already had their direction sub-field assigned)
    based on whether this entry comes before or
    after P-best-entry in the grey table list. */
```

The invention is extremely efficient and executes at very high speed on a general purpose processor. A major reason for the efficiency of the process, as described above, is the testing of the extent of particular rectangles in the input list in order to perform only the minimum required process on each rectangle and the common processing of simplified chains of rectangles during the sort operation. To carry out these operations, only relatively simple digital comparisons are required which can also be achieved at high speed.

However, as is well-understood in the art, higher levels of performance can be achieved by dedicated, special-purpose data processing circuitry such as will now be described with reference to FIGS. 10-12. It should be noted, for a full appreciation of the invention that, beyond memory accesses, the above process requires only a very few types of data testing and manipulation. Specifically, the process requires only address comparison to determine relative locations of spots, sub-fields, rectangle sections and overlap zone boundaries, digital data comparison for selecting a table list entry from the greytable list which contains data indicating whether or not a rectangle section is relatively favorable for greying and an arrangement for dividing rectangles at desired locations.

Figure 7:
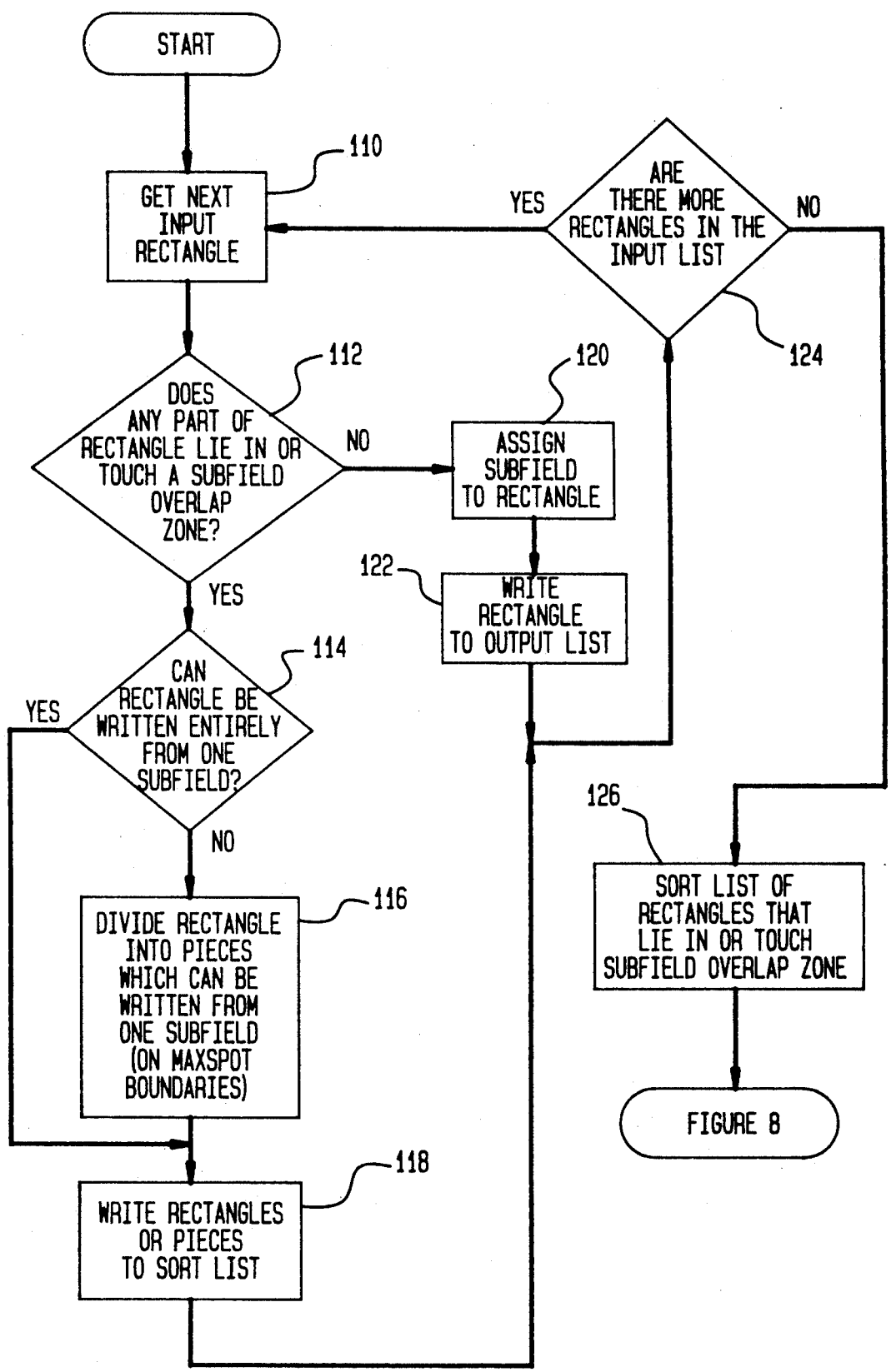
FIG. 7, 8 and 9 are flow charts illustrating the operation of the invention.
Figure 8:
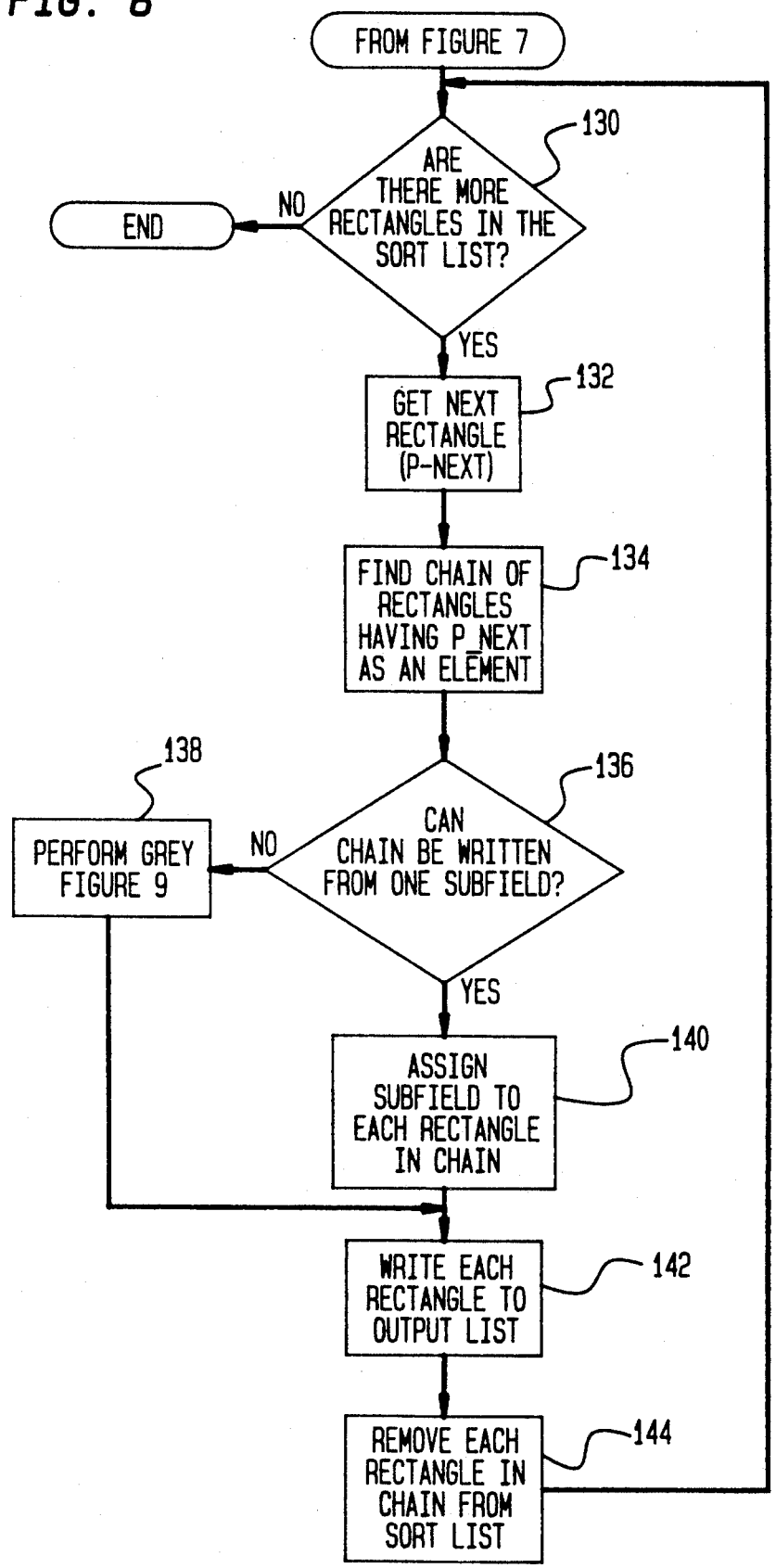
Figure 10:
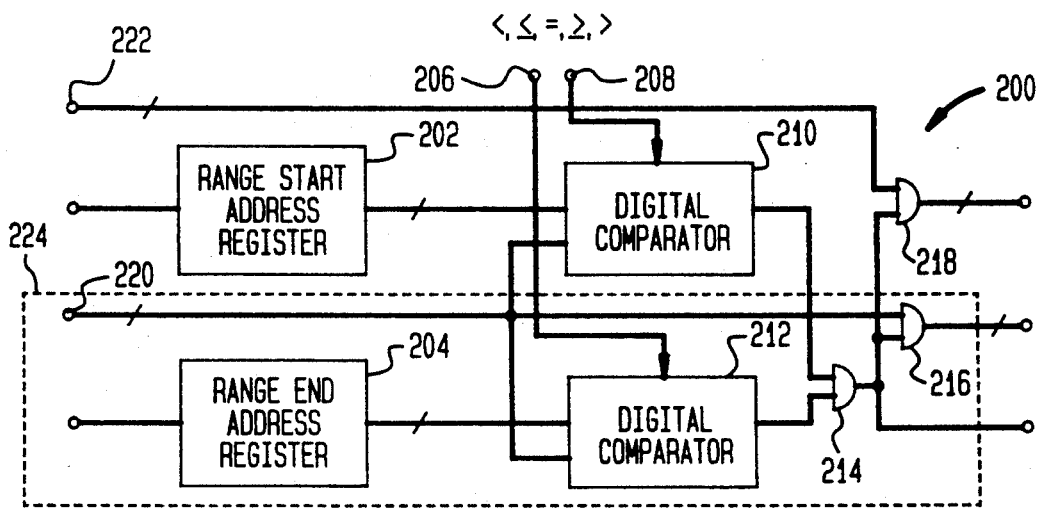
FIGS. 10, 11 and 12 are schematic diagrams of digital circuits suitable for carrying out particular operations in accordance with the invention, and FIG. 13 contains Table 1, illustrating four specific cases of the operation of the invention for subdivision of greytable entries.

An address comparison arrangement 200 suitable for the practice of the invention is shown in FIG. 10 which can carry out the testing operations of 112 and 114 of FIG. 7 and 136 of FIG. 8 as well as the determination of chains of contiguous rectangles in step 134 of FIG. 8. Tests 112, 114 and 136 require only the determination whether a rectangle lies in a particular portion of the writing area. To accomplish this function, the bounds of the area are fetched from memory, preferably a table list entry of position values characteristic of the e-beam exposure apparatus, and entered into range start address register 202 and range end address register 204. Each of these values is then provided as a reference input to a respective one of digital comparators 210 and 212. Each of the digital comparators is preferably controllable to provide a "true" output under conditions (e.g. input data is less than, less than or equal to, equal to, greater than or equal to, or greater than, the reference input) specified by control inputs 206, 208. These control inputs are set in accordance with the address comparison required. For example, to perform test 114, the left or upper boundary of a sub-field plus its extension would be entered in register 202 and the right or lower boundary of the same sub-field plus its extension would be written into register 204. Comparator 210 would be controlled to provide a true output on a "greater than or equal to" comparison and comparator 212 would be controlled to provide a true output on a "less than or equal to" comparison. Boundaries of the rectangle would then be applied sequentially to input 220 and the comparison results gated together at 214. The output of gate 214 provides an enable signal for triggering other portions of the process. It should also be noted that it would be advantageous to duplicate the comparison arrangement so that both start and end points of the rectangle could be simultaneously compared and a composite enable signal developed through further similar gating. Four of the comparison arrangements of FIG. 10 would provide simultaneous testing in both coordinate directions.

It should also be noted that each of the tests 112, 114 and 136 are followed, upon a positive result, by a step of writing data to a memory. For this purpose, gates 216 and 218 are provided to allow a gated output of multibit data when enabled by a true output of gate 214. Gates 216 and 218 would not be duplicated with the remainder of the comparison arrangement of FIG. 10 if simultaneous comparison of start and end points of a rectangle were to be provided as indicated in the preceding paragraph.

The chaining of rectangles at 134 of FIG. 8 can be accomplished in a similar manner by merely comparing start points and end points of different rectangles. Only a single digital comparator for detecting an equality, such as that within dashed line 222 or an array of and gates, would be required. However, if desired for reasons of economy of hardware, such a comparison could also be carried out by the comparison arrangement of FIG. 10 merely by loading the same address into both of registers 202 and 204 and controlling comparators 210, 212 to detect equality.

Figure 11:
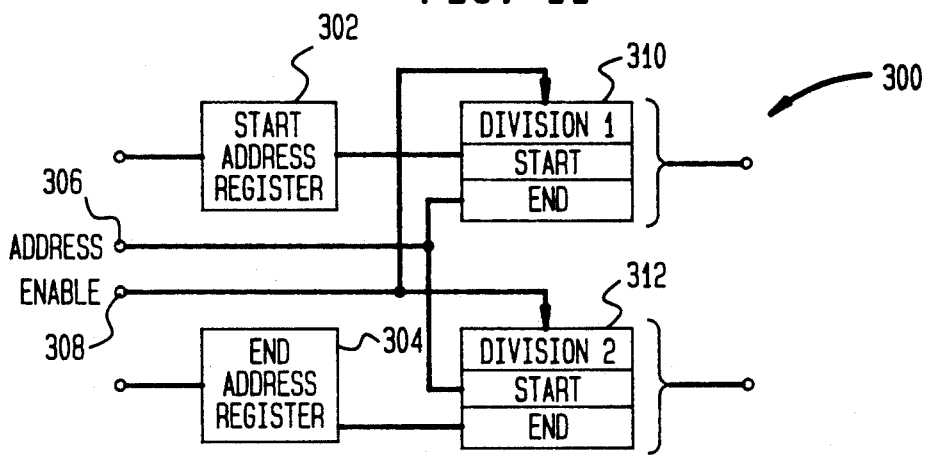

Divisions of an area are accomplished by an arrangement schematically depicted in FIG. 11. This arrangement would preferably be responsive to a comparison arrangement such as that of FIG. 10 which would determine the position at which a rectangle was to be cut. The start and end points of the rectangle or section to be cut would be written into registers 302 and 304, respectively while the comparison arrangement is set to establish when conditions for cutting are met. Possible cutting addresses are then sequentially fed to input 220 of FIG. 10, such as by incrementing a counter (not shown). When conditions for a cut are met, the comparison arrangement outputs an enable signal from gate 214 and the address which produced the favorable comparison from gate 216 which are fed to inputs 306 and 308. Registers 310 and 312 respectively receive the original start and end addresses of the rectangle or section and, when enabled by input 308, the address applied at 306 is entered as a new end point in register 310 and as a new start point in register 312. These new boundaries can then be individually evaluated to provide data for the greytable list by means of address comparison as described above with reference to FIG. 10.

Figure 12:
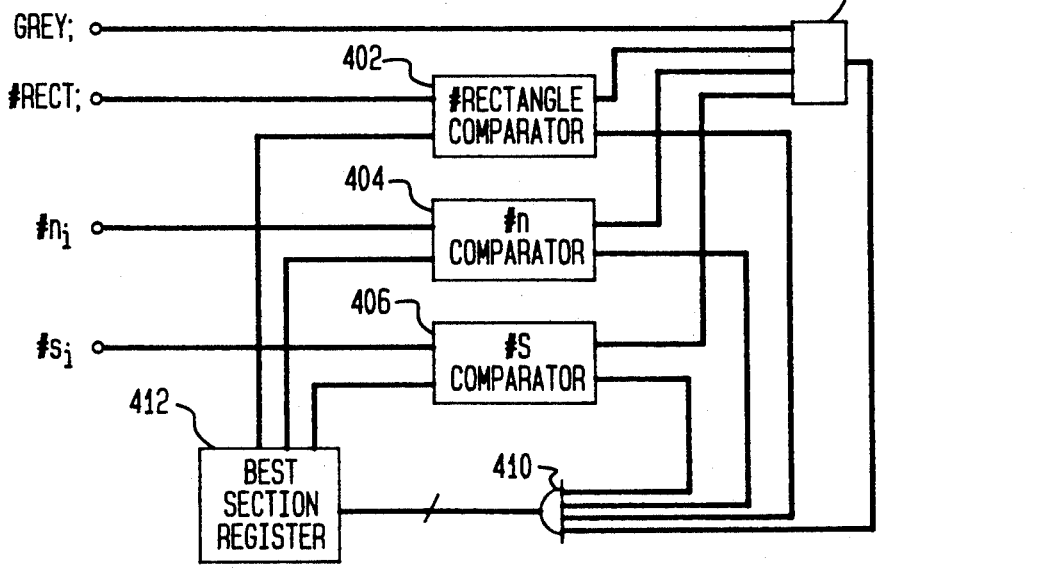

The digital comparison arrangement of FIG. 12 is suitable for evaluating the greytable list. Digital comparators 402, 404 and 406 are similar in architecture to that of FIG. 10 but are not required to compare as many bits as are required for address comparisons. Also, one comparator would only be required to provide a "true" output on detection of a "less than" condition while the other would provide a true output upon detection of a "less than or equal to" condition and outputs of individual comparators such as 210 and 212 are directly monitored. A previous best value of each #s, #m and # rectangles would be input to both digital comparators corresponding to 210 and 212 of FIG. 10. Logic 408 is arranged to provide a true output only when the input values were all not greater than the previous best values, at least one input value was less than a previous best value and the section is greyable, as indicated by the grey flag value. If these conditions are met, the values corresponding to the section being compared are written into the best section register 412 under control of gate 410. Thus, the arrangement of FIG. 12 is able to determine the best candidate section for greying in a single pass through the grey table list.

In view of the foregoing, it is seen that the present invention provides a method and apparatus for performing grey-splicing which is far more tolerant of occlusion errors between sub-fields than the prior art by determining the optimum portion of a desired pattern on which greying could be done. The procedure according to the invention may be carried out with increased efficiency by arranging for only the minimum required processing to be done on each rectangle and by sorting rectangles for greying in chains. The e-beam exposure apparatus is also operated with optimum efficiency in accordance with the invention since the number of greyed spots which must be written from each of a plurality of sub-fields is minimized.

While the invention has been described in terms of a single preferred embodiment in both hardware and software implementations, those skilled in the art will recognize that the invention can be practiced with modification within the spirit and scope of the appended claims.

Having thus described the invention, I claim:

1. A method of producing grey-splices in a pattern exposure system in which the writing area is divided into sub-fields and a desired pattern is represented by a plurality of non-overlapping rectangles, said method including the steps of determining ones of said rectangles which are wholly or partly included in a sub-field overlap zone, dividing said sub-field overlap zone into sections, examining each said section to determine at least the number of exposure spots required to form portions of said rectangles which are in said sub-field overlap zone, selecting a section in accordance with said examining step, and greying at least one said exposure spot in said section.

2. A method as recited in claim 1, including the further step of eliminating all rectangles which neither partly lie in nor touch any said sub-field overlap zone from further evaluation.

3. A method as recited in claim 2, including the further step of determining a chain of all contiguous rectangles which include a predetermined rectangle.

4. A method as recited in claim 1, wherein said dividing, examining and selecting steps are performed a plurality of times with respect to each of a plurality of sub-field overlap zones.

5. A data structure containing, for each section of a sub-field overlap zone of a writing area of an electron beam exposure apparatus, a table list entry including at least a number of spots required to form portions of a desired pattern which traverses said sub-field overlap zone.

6. A data structure as recited in claim 5 wherein said table list entry includes a pointer to a preceding table list entry corresponding to another, contiguous, section of said sub-field overlap zone.

7. A data structure as recited in claim 5, wherein said table list entry further contains a list of said rectangles which lie wholly or partly in said section.

8. A data structure as recited in claim 5, wherein said table list entry further includes a flag indicative of whether or not any spot in said section fails to conform to at least one predetermined rule.

9. A data structure as recited in claim 8, wherein said flag indicates that all spots within said section are of a predetermined size in accordance with said rule.

10. A data structure as recited in claim 8, wherein said flag indicates that all spots within said section lie wholly within said sub-field overlap zone in accordance with said rule.

11. A data structure as recited in claim 9, wherein said flag indicates that all spots within said section lie wholly within said sub-field overlap zone in accordance with said rule.

12. A system for producing grey-splices in a pattern exposure system in which the writing area is divided into sub-fields and a desired pattern is represented by a plurality of non-overlapping rectangle, said system including determining means for determining ones of said rectangles which are wholly or partly included in a sub-field overlap zone, dividing means for dividing said sub-field overlap zone into sections, examining means for examining each said section to determine at least the number of exposure spots required to form portions of said rectangles which are in said sub-field overlap zone, selecting means for selecting a section in accordance with said examining step, and greying means for greying at least one said exposure spot in said section.

13. A system as recited in claim 12, further including eliminating means for eliminating all rectangles which neither partly lie in nor touch any said sub-field overlap zone from further evaluation.

14. A system as recited in claim 13, further including determining means for determining a chain of all contiguous rectangles which include a predetermined rectangle.

15. A system as recited in claim 12, wherein said dividing, examining and selecting means are operated a plurality of times with respect to each of a plurality of sub-field overlap zones.

* * * * *